(12) United States Patent
Sonoda

(10) Patent No.: US 12,191,764 B2
(45) Date of Patent: Jan. 7, 2025

(54) CHARGE PUMP CIRCUIT AND DRIVE DEVICE

(71) Applicants: KABUSHIKI KAISHA TOSHIBA, Tokyo (JP); Toshiba Electronic Devices & Storage Corporation, Tokyo (JP)

(72) Inventor: Mitsumasa Sonoda, Kanagawa (JP)

(73) Assignees: KABUSHIKI KAISHA TOSHIBA, Tokyo (JP); TOSHIBA DEVICES & STORAGE CORPORATION, Tokyo (JP)

( * ) Notice: Subject to any disclaimer, the term of this patent is extended or adjusted under 35 U.S.C. 154(b) by 154 days.

(21) Appl. No.: 18/163,892

(22) Filed: Feb. 3, 2023

(65) Prior Publication Data

US 2024/0097564 A1   Mar. 21, 2024

(30) Foreign Application Priority Data

Sep. 16, 2022  (JP) ................................. 2022-147957

(51) Int. Cl.
| | |
|---|---|
| *H03K 17/0812* | (2006.01) |
| *H02M 3/07* | (2006.01) |
| *H02M 1/088* | (2006.01) |
| *H03K 19/20* | (2006.01) |

(52) U.S. Cl.
CPC .............. *H02M 3/07* (2013.01); *H02M 1/088* (2013.01); *H03K 19/20* (2013.01)

(58) Field of Classification Search
CPC ........ H02M 3/07; H02M 1/088; H02M 3/076; H02M 1/38; H02M 1/08; H03K 19/20
See application file for complete search history.

(56) References Cited

U.S. PATENT DOCUMENTS

| | | | |
|---|---|---|---|
| 5,923,192 A | 7/1999 | Hasegawa | |
| 6,608,505 B2 | 8/2003 | Tsuji | |
| 2020/0294743 A1* | 9/2020 | Khlat ................... | H01H 47/001 |
| 2021/0184667 A1* | 6/2021 | Hayashi ........... | H03K 17/08122 |

FOREIGN PATENT DOCUMENTS

| | | |
|---|---|---|
| JP | H10242834 A | 9/1998 |
| JP | 2006157099 A | 6/2006 |

* cited by examiner

*Primary Examiner* — Muhammad S Islam
(74) *Attorney, Agent, or Firm* — Holtz, Holtz & Volek PC

(57) ABSTRACT

A charge pump circuit includes a first capacitor including a first end supplied for a voltage, and a second end; a second capacitor including a third end supplied for a pulse signal, and a fourth end coupled to a node; a third capacitor including a fifth end supplied for the pulse signal, and sixth end; a first transistor including a seventh end coupled to the second end, an eighth end coupled to the node, and a first gate; a second transistor including a ninth end coupled to the first end, a tenth end coupled to the node, and a second gate; and a circuit including a first terminal coupled to the node, a second terminal coupled to the sixth end, a third terminal coupled to the first gate, and a fourth terminal coupled to the second gate.

16 Claims, 5 Drawing Sheets

US 12,191,764 B2

CHARGE PUMP CIRCUIT AND DRIVE DEVICE

CROSS-REFERENCE TO RELATED APPLICATIONS

This application is based upon and claims the benefit of priority from Japanese Patent Application No. 2022-147957, filed Sep. 16, 2022, the entire contents of which are incorporated herein by reference.

FIELD

Embodiments described herein relate generally to a charge pump circuit and a drive device.

BACKGROUND

A drive device configured to drive a motor or the like that handles a high current is known, and a charge pump circuit for generating a voltage higher than a power supply voltage in the drive device is also known.

DETAILED DESCRIPTION

In general, according to one embodiment, a charge pump circuit includes a first capacitor including a first end to which a first voltage is supplied; a second capacitor including a first end to which a first pulse signal is supplied, and a second end coupled to a first node; a third capacitor including a first end to which the first pulse signal is supplied; a first transistor including a first end coupled to a second end of the first capacitor, and a second end coupled to the first node; a second transistor including a first end coupled to the first end of the first capacitor, and a second end coupled to the first node; and a first circuit including a first input terminal coupled to the first node, a second input terminal coupled to a second end of the third capacitor, a first output terminal coupled to a gate of the first transistor, and a second output terminal coupled to a gate of the second transistor.

Hereinafter, an embodiment will be described with reference to the accompanying drawings. The descriptions provided hereinafter use the same reference symbol for components having approximately the same function and configuration. Especially when components having the same or substantially the same configuration are to be distinguished from each other, different characters or numerals may be added to the common reference symbol.

1. Configuration 1. 1 Drive Device

Figure 1:
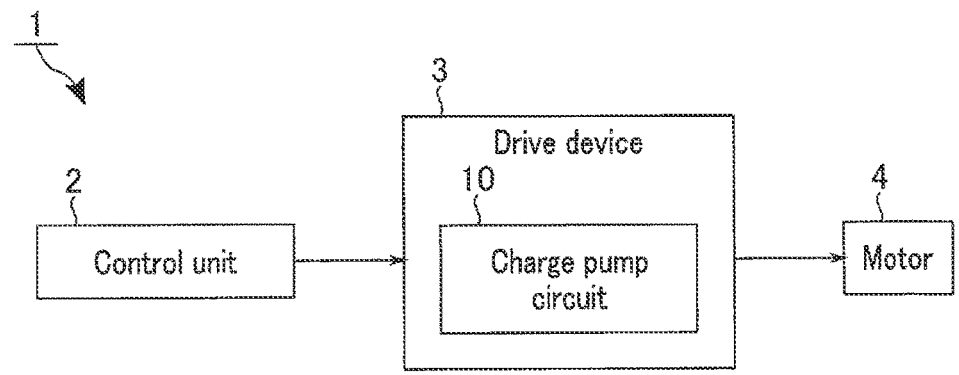
FIG. 1 is a block diagram showing an example of a configuration of a motor drive system including a drive device according to an embodiment.

FIG. 1 is a block diagram showing an example of a configuration of a motor drive system including a drive device according to an embodiment. The motor drive system 1 includes a control unit 2, a drive device 3, and a motor 4. The motor drive system 1 is an application that executes a predetermined operation using a torque obtained from the motor 4.

The control unit 2 controls the whole of the motor drive system 1. The control unit 2 includes, for example, a processor and a memory. The processor in the control unit 2 generates a control signal based on a program prestored in the memory, and controls the drive device 3.

The drive device 3 is, for example, an integrated circuit (IC) chip that functions as a motor controller driver (MCD). The drive device 3 drives the motor 4 in accordance with the control signal from the control unit 2. Specifically, a charge pump circuit 10 is incorporated into the drive device 3. The charge pump circuit 10 is a voltage generation circuit configured to generate a voltage for use in driving the motor 4. The charge pump circuit 10 is also referred to as a booster circuit. The drive device 3 drives the motor 4 using the voltage generated in the charge pump circuit 10.

1. 2 Charge Pump Circuit

Figure 2:
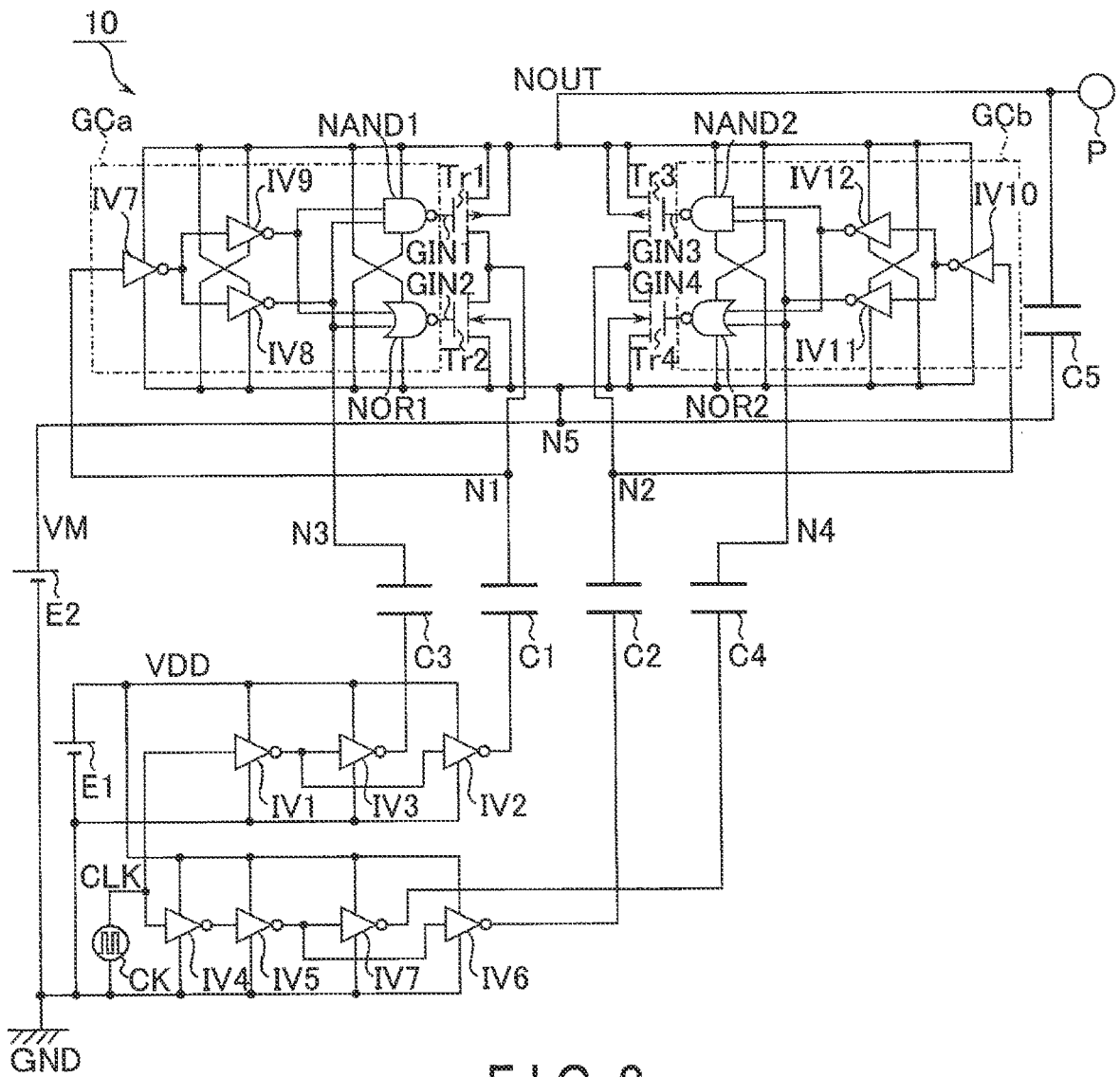
FIG. 2 is a circuit diagram showing an example of a configuration of a charge pump circuit of the drive device according to the embodiment.

Next, a configuration of the charge pump circuit of the drive device according to the embodiment will be described. FIG. 2 is a circuit diagram showing an example of a configuration of the charge pump circuit of the drive device according to the embodiment.

The charge pump circuit 10 is a synchronous rectifier circuit. The charge pump circuit 10 includes a plurality of power supplies E, a clock generator CK, a plurality of inverters IV, a plurality of capacitors C, a plurality of NOR circuits NOR, a plurality of NAND circuits NAND, a plurality of transistors Tr, and an output terminal P. The power supplies E include power supplies E1 and E2.

The inverters IV include inverters IV1, IV2, IV3, IV4, IV5, IV6, IV7, IV8, IV9, IV10, IV11, and IV12. The capacitors C include capacitors C1, C2, C3, C4, and C5. The NOR circuits NOR include NOR circuits NOR1 and NOR2. The NAND circuits NAND include NAND circuits NAND1 and NAND2. The transistors Tr include transistors Tr1, Tr2, Tr3, and Tr4. The transistors Tr1 and Tr3 are P-type metal-oxide-semiconductor (MOS) transistors. The transistors Tr2 and Tr4 are N-type MOS transistors.

The power supply E1 is a logic power supply. The power supply E1 generates a voltage VDD to a ground GND. The voltage VDD drives the inverters IV, the NOR circuits NOR, and the NAND circuits NAND.

The clock generator CK generates a clock signal CLK. The clock signal CLK is, for example, a pulse signal. In accordance with a cycle of the clock signal CLK, the charge pump circuit 10 executes a boosting operation to boost a voltage output to the output terminal P. Specifically, the voltage output to the output terminal P is boosted in response to a rise and a fall of the clock signal CLK. Details of the boosting operation will be described later.

A first voltage input terminal of each of the inverters IV1, IV2, IV3, IV4, IV5, IV6, and IV7 is grounded to the ground GND. The voltage VDD is supplied to a second voltage input terminal of each of the inverters IV1, IV2, IV3, IV4, IV5, IV6, and IV7. Accordingly, each of the inverters IV1, IV2, IV3, IV4, IV5, IV6, and IV7 is configured to output the voltage VDD as an "H" level voltage from a signal output terminal, and output the voltage of the ground GND (for example, 0 V) as an "L" level voltage.

The clock signal CLK is input to a signal input terminal of the inverter IV1. The signal output terminal of the inverter IV1 is coupled to a signal input terminal of each of the inverters IV2 and IV3. The signal output terminal of the inverter IV2 is coupled to a first end of the capacitor C1. The signal output terminal of the inverter IV3 is coupled to a first end of the capacitor C3.

The clock signal CLK is input to the signal input terminal of the inverter IV4. The signal output terminal of the inverter IV4 is coupled to a signal input terminal of the inverter IV5. The signal output terminal of the inverter IV5 is coupled to a signal input terminal of each of the inverters IV6 and IV7. The signal output terminal of the inverter IV6 is coupled to a first end of the capacitor C2. The signal output terminal of the inverter IV7 is coupled to a first end of the capacitor C4.

A second end of the capacitor C1 is coupled to a node N1. A second end of the capacitor C2 is coupled to a node N2. A second end of the capacitor C3 is coupled to a node N3. A second end of the capacitor C4 is coupled to a node N4.

The power supply E2 is a motor power supply. The power supply E2 generates a voltage VM to the ground GND. The voltage VM is used for boosting a voltage transferred to the output terminal P. The voltage VM is supplied to the node N5.

A first voltage input terminal of each of the inverters IV7, IV8, IV9, IV10, IV11, and IV12, the NOR circuits NOR1 and NOR2, and the NAND circuits NAND1 and NAND2, and a first end of the capacitor C5 are coupled to a node NOUT. A second voltage input terminal of each of the inverters IV7, IV8, IV9, IV10, IV11, and IV12, the NOR circuits NOR1 and NOR2, and the NAND circuits NAND1 and NAND2, and a second end of the capacitor C5 are coupled to the node N5. Accordingly, each of the inverters IV7, IV8, IV9, IV10, IV11, and IV12, the NOR circuits NOR1 and NOR2, and the NAND circuits NAND1 and NAND2 is configured to output a voltage of the node NOUT as the "H" level voltage from a signal output terminal, and to output a voltage VM of the node N5 as the "L" level voltage.

The signal input terminal of the inverter IV7 is coupled to the node N1. The signal output terminal of the inverter IV7 is coupled to a signal input terminal of each of the inverters IV8 and IV9. The signal output terminal of the inverter IV8 is coupled to the node N3.

A first input terminal of each of the NOR circuit NOR1 and the NAND circuit NAND1 is coupled to the node N3. A second input terminal of each of the NOR circuit NOR1 and the NAND circuit NAND1 is coupled to the signal output terminal of the inverter IV9. Thus, the NOR circuit NOR1 outputs the "L" level voltage from the signal output terminal unless both of the voltages of the node N3 and the signal output terminal of the inverter IV9 are at the "L" level. The NOR circuit NOR1 outputs the "H" level voltage from the signal output terminal if both the voltages of the node N3 and the signal output terminal of the inverter IV9 are at the "L" level.

A source of the transistor Tr1 is coupled to the node NOUT. A drain of the transistor Tr1 is coupled to the node N1. A gate of the transistor Tr1 is coupled to the signal output terminal of the NAND circuit NAND1 via a node GIN1.

A source of the transistor Tr2 is coupled to the node N5. A drain of the transistor Tr2 is coupled to the node N1. A gate of the transistor Tr2 is coupled to the signal output terminal of the NOR circuit NOR1 via a node GIN2.

Thus, the inverters IV7, IV8, and IV9, the NOR circuit NOR1, and the NAND circuit NAND1 have a function for controlling a voltage supplied to the respective gates of the transistors Tr1 and Tr2. Each of the inverters IV7, IV8, and IV9, the NOR circuit NOR1, and the NAND circuit NAND1 is also referred to as a gate control circuit GCa. The gate control circuit GCa is configured to create a time zone in which the transistors Tr1 and Tr2 are both OFF and not to create a time zone in which the transistors Tr1 and Tr2 are both ON.

The signal input terminal of the inverter IV10 is coupled to the node N2. The signal output terminal of the inverter IV10 is coupled to the signal input terminal of each of the inverters IV11 and IV12. The signal output terminal of the inverter IV11 is coupled to the node N4.

A first input terminal of each of the NOR circuit NOR2 and the NAND circuit NAND2 is coupled to the node N4. A second input terminal of each of the NOR circuit NOR2 and the NAND circuit NAND2 is coupled to the signal output terminal of the inverter IV12.

A source of the transistor Tr3 is coupled to the node NOUT. A drain of the transistor Tr3 is coupled to the node N2. A gate of the transistor Tr3 is coupled to the signal output terminal of the NAND circuit NAND2 via a node GIN3.

A source of the transistor Tr4 is coupled to the node N5. A drain of the transistor Tr4 is coupled to the node N2. A gate of the transistor Tr4 is coupled to the signal output terminal of the NOR circuit NOR2 via a node GIN4.

The output terminal P is coupled to the node NOUT. The output terminal P outputs a voltage boosted by a boosting operation in the charge pump circuit 10 to outside of the charge pump circuit 10 within the drive device 3. In the configuration as described above, a set of the transistors Tr1 and Tr2 and a set of the transistors Tr3 and Tr4 each function as a rectifier element. The capacitors C1 and C2 each function as a pumping capacitor. The capacitors C3 and C4 function as level shift capacitors respectively arranged in parallel to the capacitors C1 and C2. The power supply E1, the clock generator CK, and the inverters IV1, IV2, IV3, IV4, IV5, IV6, and IV7 function as a drive circuit for the pumping capacitors.

The inverters IV10, IV11, and IV12, the NOR circuit NOR2, and the NAND circuit NAND2 have a function for controlling a voltage supplied to the respective gates of the transistors Tr3 and Tr4. Each of the inverters IV10, IV11, and IV12, the NOR circuit NOR2, and the NAND circuit NAND2 is also referred to as a gate control circuit GCb. The gate control circuit GCb is configured to create a time zone in which the transistors Tr3 and Tr4 are both OFF and not to create a time zone in which the transistors Tr3 and Tr4 are both ON.

2. Operation

2.1 Overview of Boosting Operation

First, an overview of the boosting operation will be explained.

Figure 3:
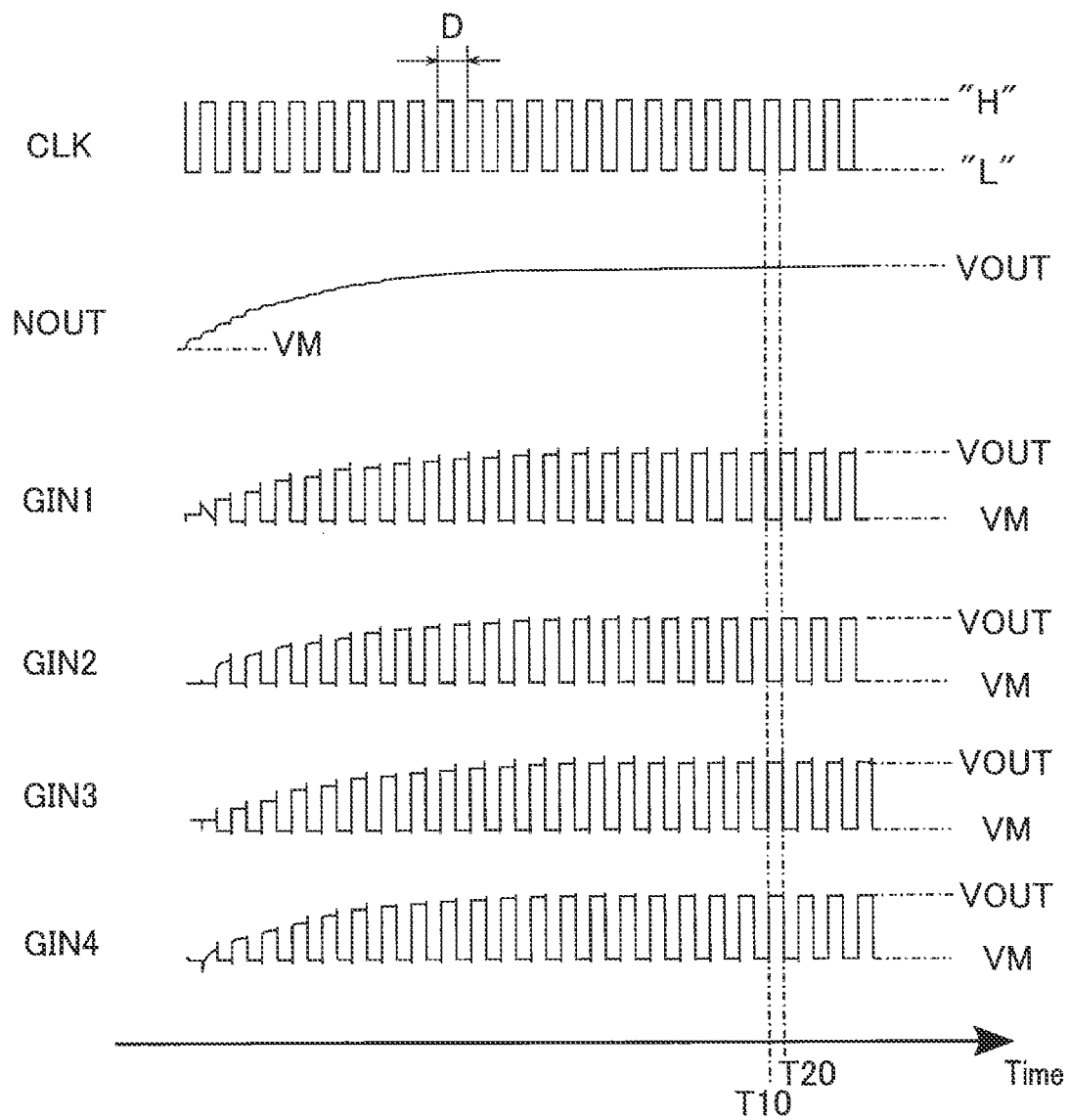
FIG. 3 is a waveform chart showing an example of a boosting operation in the charge pump circuit of the drive device according to the embodiment.

FIG. 3 is a waveform chart showing an example of the boosting operation in the charge pump circuit of the drive device according to the embodiment. FIG. 3 shows the clock signal CLK, and a change with time of the voltage of each of the nodes NOUT, GIN1, GIN2, GIN3, and GIN4.

As shown in FIG. 3, the clock signal CLK cyclically changes between the "H" level and the "L" level in a cycle D. The voltage of the node NOUT is gradually boosted from the voltage VM in accordance with rises and falls of the clock signal CLK, and approaches asymptotically to a voltage VOUT.

The voltage VOUT takes, for example, a value obtained by subtracting a sum of a drain-source voltage of the transistor Tr1 and a drain-source voltage of the transistor Tr2 or a sum of a drain-source voltage of the transistor Tr3 and a drain-source voltage of the transistor Tr4 from a sum of the voltage VM and the voltage VDD. Thus, if the sum of the drain-source voltage of the transistor Tr1 and the drain-source voltage of the transistor Tr2 and the sum of the drain-source voltage of the transistor Tr3 and the drain-source voltage of the transistor Tr4 are substantially equal to a voltage 2Vds, the voltage VOUT may be a voltage (VDD+VM−2Vds).

Each of the voltage of the node GIN1 and the voltage of the node GIN2 transitions from the "H" level to the "L" level in accordance with the rise of the clock signal CLK (for example, at time T10 in FIG. 3). Each of the voltage of the node GIN1 and the voltage of the node GIN2 transitions from the "L" level to the "H" level in accordance with the fall of the clock signal CLK (for example, at time T20 in FIG. 3). Each of the voltages of the nodes GIN1 and GIN2 when the clock signal CLK is at the "L" level is gradually boosted from the voltage VM each time the cycle of the clock signal CLK is repeated, and approaches asymptotically to the voltage VOUT.

On the other hand, each of the voltage of the node GIN3 and the voltage of the node GIN4 transitions from the "L" level to the "H" level in accordance with the rise of the clock signal CLK (for example, at time T10 in FIG. 3). Each of the voltage of the node GIN3 and the voltage of the node GIN4 transitions from the "H" level to the "L" level in accordance with the fall of the clock signal CLK (for example, at time T20 in FIG. 3). Each of the voltages of the nodes GIN3 and GIN4 when the clock signal CLK is at the "H" level is gradually boosted from the voltage VM each time the cycle of the clock signal CLK is repeated, and approaches asymptotically to the voltage VOUT.

2.2 Details of Boosting Operation at Rise of Clock Signal

Next, details of the boosting operation at a rise of the clock signal will be explained.

Figures 4, 5:
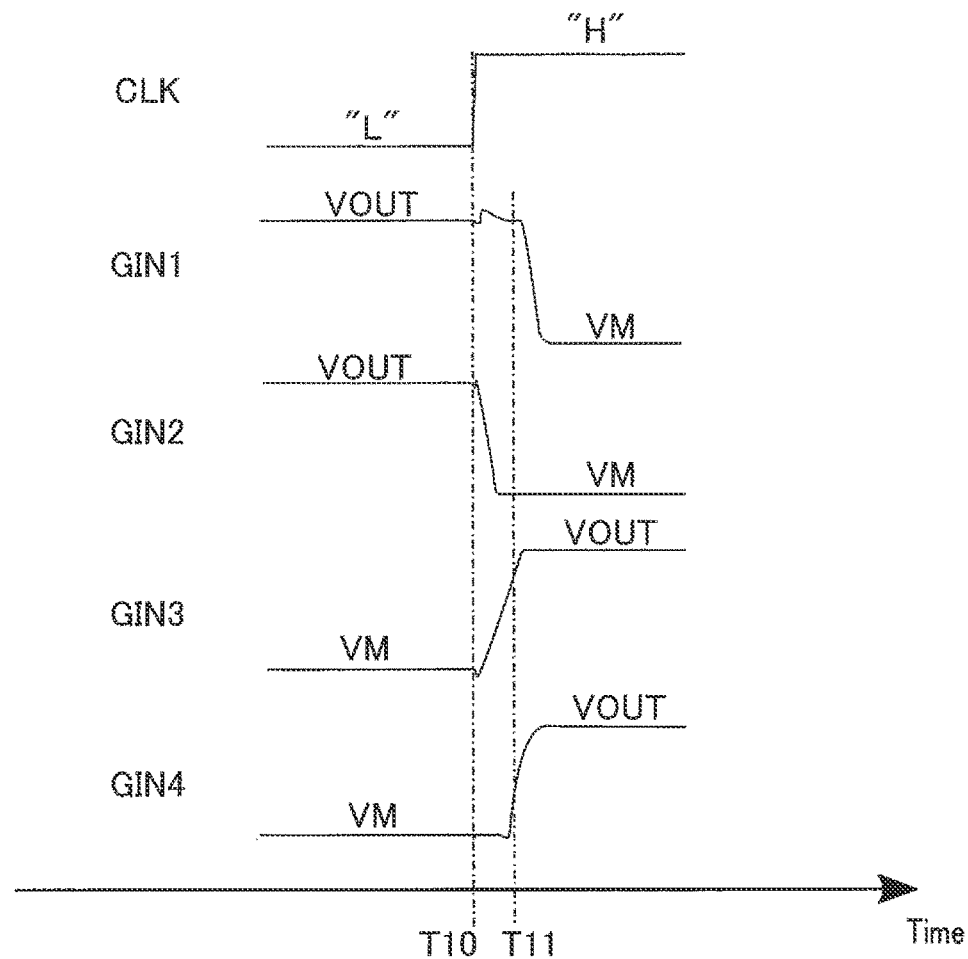
FIG. 4 is a waveform chart showing an example of a boosting operation at a clock signal rising time in the charge pump circuit of the drive device according to the embodiment.
FIG. 5 is a diagram showing an example of a boosting operation at a clock signal rising time in the charge pump circuit of the drive device according to the embodiment.

FIG. 4 is a waveform chart showing an example of the boosting operation at a clock signal rising time in the charge pump circuit of the drive device according to the embodiment. FIG. 5 is a diagram showing an example of the boosting operation at the clock signal rising time in the charge pump circuit of the drive device according to the embodiment. FIG. 4 and FIG. 5 correspond to time T10 in FIG. 3 and a time zone close to time T10.

Before time T10, the clock signal CLK is at the "L" level. Accordingly, the first end of each of the capacitors C1 and C3 is grounded to the ground GND. At this time, the voltages of the nodes N1 and N3 are both at the "L" level. Therefore, a signal output from the NAND circuit NAND1 to the node GIN1 and a signal output from the NOR circuit NOR1 to the node GIN2 are both at the "H" level. Therefore, the transistor Tr1 is OFF and the transistor Tr2 is ON. Thus, the node N1 is coupled to the node N5 through the transistor Tr2, whereby the voltage VM is supplied to the second end of the capacitor C1.

The voltage VDD is supplied to the first end of each of the capacitors C2 and C4. At this time, the voltages of the nodes N2 and N4 are both at the "H" level. Therefore, a signal output from the NAND circuit NAND2 to the node GIN3 and a signal output from the NOR circuit NOR2 to the node GIN4 are both at the "L" level. Therefore, the transistor Tr3 is ON and the transistor Tr4 is OFF. Thus, the node N2 is coupled to the node NOUT through the transistor Tr3, whereby the capacitor C5 is charged by the capacitor C2.

At time T10, the clock signal CLK rises from the "L" level to the "H" level.

Accordingly, supply of the voltage VDD to the first end of each of the capacitors C1 and C3 is started. As a result, voltage of the node N3 changes from the "L" level to the "H" level. On the other hand, since the node N1 is coupled to the node N5, the voltage of the node N1 changes later than the node N3. Thus, the voltage of the node N1 is maintained at the "L" level. Accordingly, a signal output from the NAND circuit NAND1 to the node GIN1 is maintained at the "H" level. A signal output from the NOR circuit NOR1 to the node GIN2 changes from the "H" level to the "L" level. Therefore, both the transistors Tr1 and Tr2 are OFF.

The second end of each of the capacitors C2 and C4 is grounded to the ground GND. Accordingly, the voltage of the node N4 changes from the "H" level to the "L" level. On the other hand, since the node N2 is coupled to the node NOUT, the voltage of the node N2 changes later than the node N4. Thus, the voltage of the node N2 is maintained at the "H" level. Accordingly, a signal output from the NAND circuit NAND2 to the node GIN3 changes from the "L" level to the "H" level. A signal output from the NOR circuit NOR2 to the node GIN4 is maintained at the "L" level. Therefore, both the transistors Tr3 and Tr4 are OFF.

At time T11, the voltage of the node N1 rises to the "H" level, whereas the voltage of the node N2 falls to the "L" level.

Accordingly, a signal output from the NAND circuit NAND1 to the node GIN1 changes from the "H" level to the "L" level. A signal output from the NOR circuit NOR1 to the node GIN2 is maintained at the "L" level. Therefore, the transistor Tr2 is maintained to be OFF, while the transistor Tr1 is turned ON. The node N1 is coupled to the node NOUT through the transistor Tr1, whereby charging of the capacitor C5 by the capacitor C1 is started.

A signal output from the NAND circuit NAND2 to the node GIN3 is maintained at the "H" level. A signal output from the NOR circuit NOR2 to the node GIN4 changes from the "L" level to the "H" level. Therefore, the transistor Tr3 is maintained to be OFF, while the transistor Tr4 is turned ON. Thus, the node N2 is coupled to the node N5 through the transistor Tr4, whereby the voltage VM is supplied to the second end of the capacitor C2.

Due to the operation described above, when the clock signal CLK rises, the state in which the transistor Tr1 is OFF and the transistor Tr2 is ON is transitioned to the state in which the transistor Tr1 is ON and the transistor Tr2 is OFF via the state in which the transistors Tr1 and Tr2 are both OFF. Similarly, when the clock signal CLK rises, the state in which the transistor Tr3 is ON and the transistor Tr4 is OFF is transitioned to the state in which the transistor Tr3 is OFF and the transistor Tr4 is ON via the state in which the transistors Tr3 and Tr4 are both OFF.

2. 3 Details of Boosting Operation at Fall of Clock Signal

Next, details of the boosting operation at a fall of the clock signal will be explained.

Figures 6, 7:
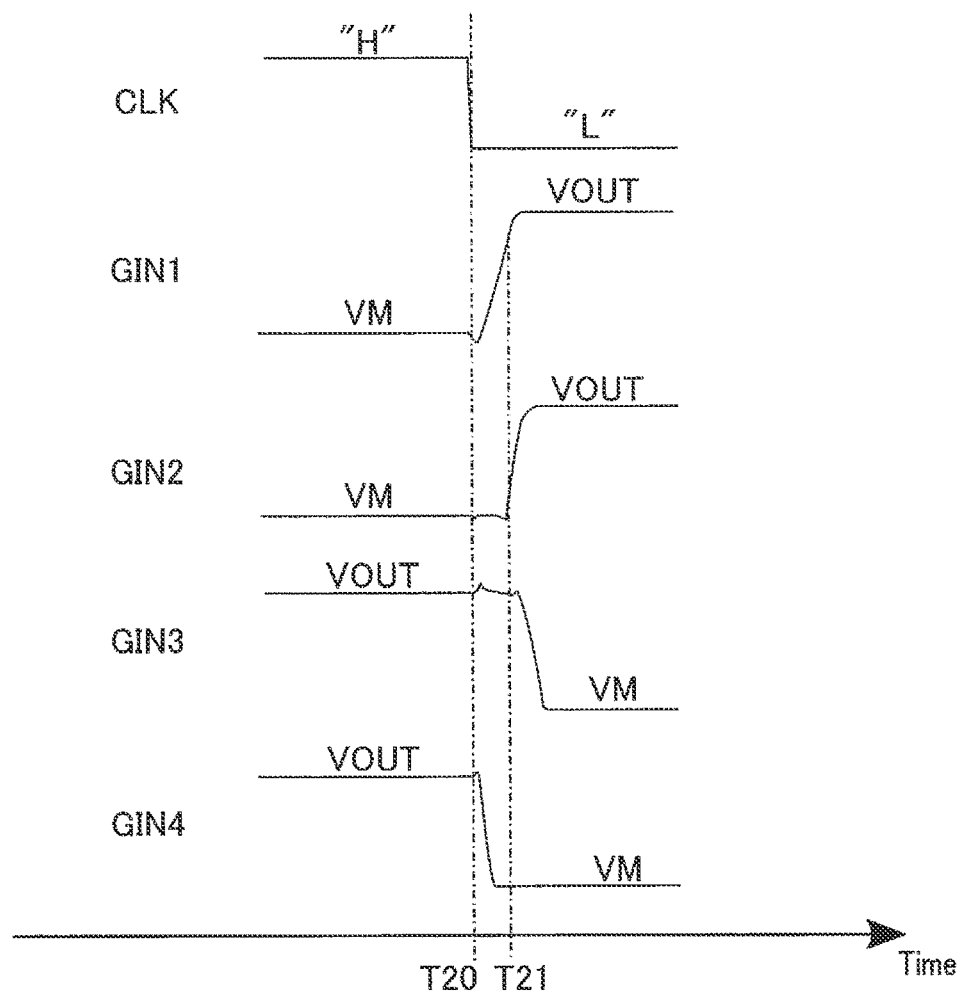
FIG. 6 is a waveform chart showing an example of a boosting operation at a clock signal falling time in the charge pump circuit of the drive device according to the embodiment.
FIG. 7 is a diagram showing an example of a boosting operation at a clock signal falling time in the charge pump circuit of the drive device according to the embodiment.

FIG. 6 is a waveform chart showing an example of the boosting operation at a clock signal falling time in the charge pump circuit of the drive device according to the embodiment. FIG. 7 is a diagram showing an example of the boosting operation at the clock signal falling time in the charge pump circuit of the drive device according to the embodiment. FIG. 6 and FIG. 7 correspond to time T20 in FIG. 3 and a time zone close to time T20.

Before time T20, the clock signal CLK is at the "H" level.

Accordingly, the voltage VDD is supplied to the first end of each of the capacitors C1 and C3. At this time, the voltages of the nodes N1 and N3 are both at the "H" level. Therefore, a signal output from the NAND circuit NAND1 to the node GIN1 and a signal output from the NOR circuit NOR1 to the node GIN2 are both at the "L" level. Therefore, the transistor Tr1 is ON and the transistor Tr2 is OFF. Thus, the node N1 is coupled to the node NOUT through the transistor Tr1, whereby the capacitor C5 is charged by the capacitor C1.

The first end of each of the capacitors C2 and C4 is grounded to the ground GND. At this time, the voltages of the nodes N2 and N4 are both at the "L" level. Therefore, a signal output from the NAND circuit NAND2 to the node GIN3 and a signal output from the NOR circuit NOR2 to the node GIN4 are both at the "H" level. Therefore, the transistor Tr3 is OFF and the transistor Tr4 is ON. Thus, the node N2 is coupled to the node N5 through the transistor Tr4, whereby the voltage VM is supplied to the second end of the capacitor C2.

At time T20, the clock signal CLK falls from the "H" level to the "L" level.

Accordingly, the second end of each of the capacitors C1 and C3 is grounded to the ground GND. The voltage of the node N3 changes from the "H" level to the "L" level. On the other hand, since the node N1 is coupled to the node NOUT, the voltage of the node N1 changes later than the node N3. As a result, the voltage of the node N1 is maintained at the "H" level. Therefore, a signal output from the NAND circuit NAND1 to the node GIN1 changes from the "L" level to the "H" level. A signal output from the NOR circuit NOR1 to the node GIN3 is maintained at the "L" level. Therefore, both the transistors Tr1 and Tr2 are OFF.

In addition, supply of the voltage VDD to the first end of each of the capacitors C2 and C4 is started. Accordingly, the voltage of the node N4 changes from the "L" level to the "H" level. On the other hand, since the node N2 is coupled to the node N5, the voltage of the node N2 changes later than the node N4. As a result, the voltage of the node N2 is maintained at the "L" level. Therefore, a signal output from the NAND circuit NAND2 to the node GIN3 is maintained at the "H" level. A signal output from the NOR circuit NOR2 to the node GIN4 changes from the "H" level to the "L" level. Therefore, both the transistors Tr3 and Tr4 are OFF.

At time T21, the voltage of the node N1 falls to the "L" level, whereas the voltage of the node N2 rises to the "H" level.

Accordingly, a signal output from the NAND circuit NAND1 to the node GIN1 is maintained at the "H" level. A signal output from the NOR circuit NOR1 to the node GIN2 changes from the "L" level to the "H" level. Therefore, the transistor Tr1 is maintained to be OFF, while the transistor Tr2 is turned ON. Thus, the node N1 is coupled to the node N5 through the transistor Tr2, whereby the voltage VM is supplied to the second end of the capacitor C1.

Furthermore, a signal output from the NAND circuit NAND2 to the node GIN3 changes from the "H" level to the "L" level. A signal output from the NOR circuit NOR2 to the node GIN4 is maintained at the "L" level. Therefore, the transistor Tr4 is maintained to be OFF, while the transistor Tr3 is turned ON. Thus, the node N2 is coupled to the node NOUT through the transistor Tr3, whereby charging of the capacitor C5 by the capacitor C2 is started.

Due to the operation described above, when the clock signal CLK falls, the state in which the transistor Tr1 is ON and the transistor Tr2 is OFF is transitioned to the state in which the transistor Tr1 is OFF and the transistor Tr2 is ON via the state in which the transistors Tr1 and Tr2 are both OFF. Similarly, when the clock signal CLK falls, the state in which the transistor Tr3 is OFF and the transistor Tr4 is ON is transitioned to the state in which the transistor Tr3 is ON and the transistor Tr4 is OFF via the state in which the transistors Tr3 and Tr4 are both OFF.

3. Effects of Present Embodiment

According to the embodiment, the voltage of the node N1 is input, to the gate control circuit GCa, as an output state signal of the transistors Tr1 and Tr2 functioning as a rectifier element. The voltage of the node N3 is also input to the gate control circuit GCa, as an input signal from the drive circuit for the pumping capacitors. As a result, based on these signals of the two types, the gate control circuit GCa can discriminate among the state in which both the transistors Tr1 and Tr2 are OFF, the state in which one of the transistors Tr1 and Tr2 is ON and the other is OFF, and the state in which both the transistors Tr1 and Tr2 are ON. Therefore, the gate control circuit GCa can transition from the state in which the transistor Tr1 is ON and the transistor Tr2 is OFF to the state in which the transistor Tr1 is OFF and the transistor Tr2 is ON via the state in which the transistors Tr1 and Tr2 are both OFF. The gate control circuit GCa can transition from the state in which the transistor Tr1 is OFF and the transistor Tr2 is ON to the state in which the transistor Tr1 is ON and the transistor Tr2 is OFF via the state in which the transistors Tr1 and Tr2 are both OFF. Therefore, it is possible to suppress a breakthrough current that is generated when the transistors Tr1 and Tr2 are both ON, thereby preventing the voltage VOUT output from the output terminal P from being substantially reduced along with the generation of a breakthrough current.

Furthermore, the voltage of the node N2 is input, to the gate control circuit GCb, as an output state signal of the transistors Tr3 and Tr4 functioning as a rectifier element. The voltage of the node N4 is also input to the gate control circuit GCb, as an input signal from the drive circuit for the pumping capacitors. As a result, based on these signals of the two types, the gate control circuit GCb can discriminate among the state in which both the transistors Tr3 and Tr4 are OFF, the state in which one of the transistors Tr3 and Tr4 is ON and the other is OFF, and the state in which both the transistors Tr3 and Tr4 are ON. Therefore, the gate control circuit GCb can transition from the state in which the transistor Tr3 is ON and the transistor Tr4 is OFF to the state in which the transistor Tr3 is OFF and the transistor Tr4 is ON via the state in which the transistors Tr3 and Tr4 are both OFF. The gate control circuit GCb can transition from the state in which the transistor Tr3 is OFF and the transistor Tr4 is ON to the state in which the transistor Tr3 is ON and the transistor Tr4 is OFF via the state in which the transistors Tr3 and Tr4 are both OFF. Therefore, it is possible to suppress a breakthrough current that is generated when the transistors Tr3 and Tr4 are both ON, thereby preventing the voltage VOUT output from the output terminal P from being substantially reduced along with the generation of a breakthrough current.

Specifically, the gate control circuit GCa includes the NAND circuit NAND1 having the output terminal coupled to the gate of the transistor Tr1, and the NOR circuit NOR1 having the output terminal coupled to the gate of the transistor Tr2. The gate control circuit GCb includes the NAND circuit NAND2 having the output terminal coupled to the gate of the transistor Tr3, and the NOR circuit NOR2 having the output terminal coupled to the gate of the transistor Tr4. Thus, there is provided a configuration in which the number of MOS transistors to be used is minimized, while the functions of the gate control circuits GCa and GCb are satisfied. Accordingly, the implementation area of the charge pump circuit 10 can be reduced. Therefore, the charge pump circuit 10 can be incorporated into the drive device 3.

4. Modification

In the embodiment described above, the charge pump circuit 10 is configured to include the logic power supply and the motor power supply. However, the embodiment is not limited to this configuration. The charge pump circuit 10 may be configured to include a single power supply that can be used as both a logic power supply and a motor power supply. The description provided below will concentrate mainly on the aspects of the configuration and the operation that are different from those of the embodiment. Descriptions of configurations and operations similar to those of the embodiment will be omitted as appropriate.

Figure 8:
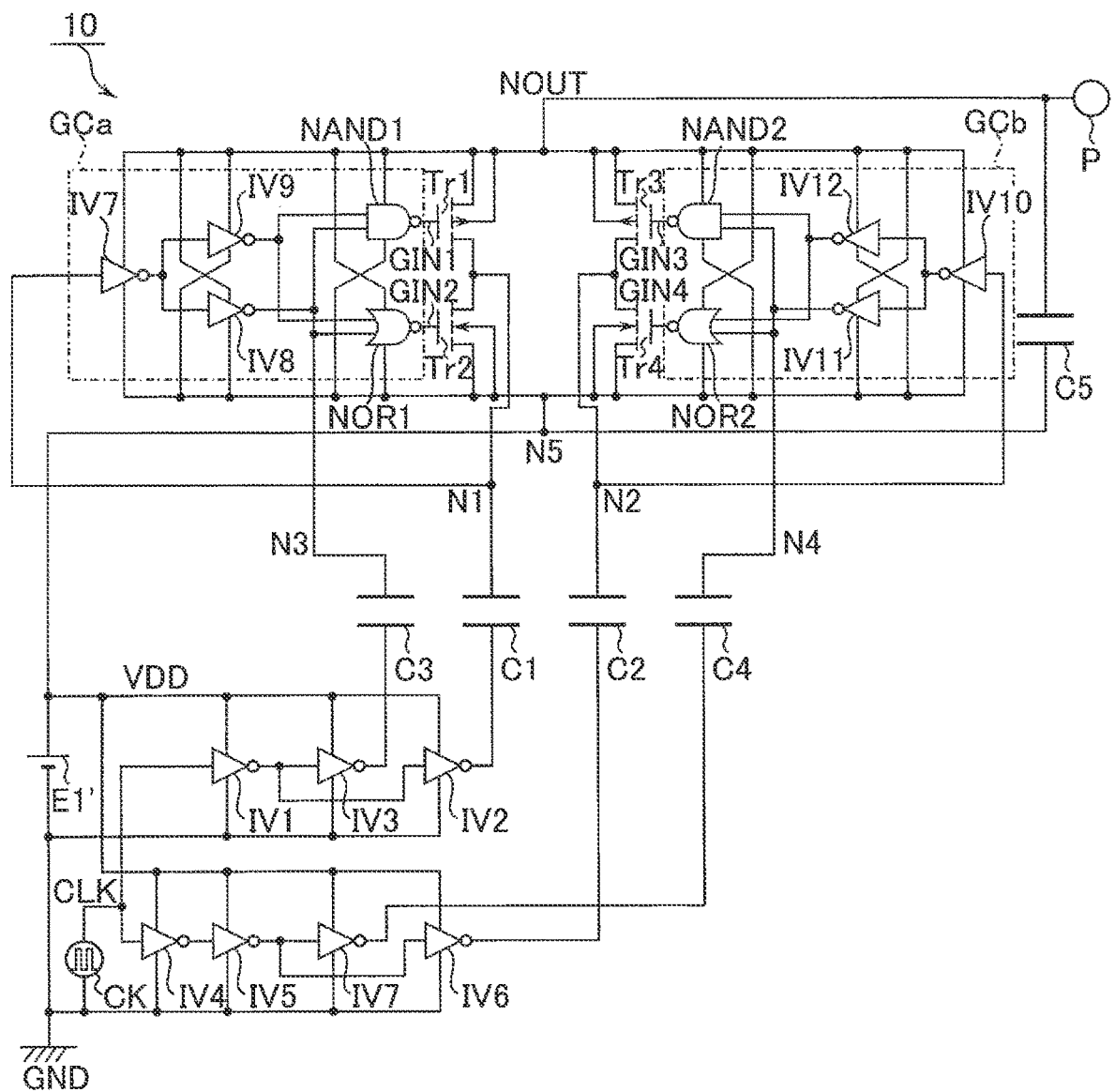
FIG. 8 is a circuit diagram showing an example of a configuration of a charge pump circuit of a drive device according to a modification.

FIG. 8 is a circuit diagram showing an example of a configuration of a charge pump circuit of a drive device according to a modification. As shown in FIG. 8, a charge pump circuit 10 may include a single power supply E1'.

The power supply E1' can be used as both a logic power supply and a motor power supply. The power supply E1' generates a voltage VDD to a ground GND. The power supply E1' supplies the voltage VDD to a second voltage input terminal of each of inverters IV1, IV2, IV3, IV4, IV5, IV6, and IV7. The power supply E1' also supplies the voltage VDD to a first end of a capacitor C5 via a node N5.

With this configuration, in the same manner as in the embodiment, the voltage VOUT output from the output terminal P can be prevented from being substantially reduced along with the generation of a breakthrough current.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A charge pump circuit comprising:
   a first capacitor including a first end to which a first voltage is supplied;
   a second capacitor including a first end to which a first pulse signal is supplied, and a second end coupled to a first node;
   a third capacitor including a first end to which the first pulse signal is supplied;
   a first transistor including a first end coupled to a second end of the first capacitor, and a second end coupled to the first node;
   a second transistor including a first end coupled to the first end of the first capacitor, and a second end coupled to the first node; and
   a first circuit including a first input terminal coupled to the first node, a second input terminal coupled to a second end of the third capacitor, a first output terminal coupled to a gate of the first transistor, and a second output terminal coupled to a gate of the second transistor.

2. The charge pump circuit according to claim 1, wherein the first circuit includes a first NAND circuit and a first NOR circuit,
   the first NAND circuit including:
      a first input terminal coupled to the first node;
      a second input terminal coupled to the second end of the third capacitor; and
      an output terminal coupled to the gate of the first transistor,
   the first NOR circuit including:
      a first input terminal coupled to the first node;
      a second input terminal coupled to the second end of the third capacitor; and
      an output terminal coupled to the gate of the second transistor.

3. The charge pump circuit according to claim 1, wherein the first transistor is a P-type MOS transistor, and the second transistor is an N-type MOS transistor.

4. The charge pump circuit according to claim 3, wherein the first end of each of the first transistor and the second transistor is a source, and the second end of each of the first transistor and the second transistor is a drain.

5. The charge pump circuit according to claim 1, further comprising:
   a fourth capacitor including a first end to which a second pulse signal is supplied, and a second end coupled to a second node, the second pulse signal being an inverted signal of the first pulse signal;
   a fifth capacitor including a first end to which the second pulse signal is supplied;
   a third transistor including a first end coupled to the second end of the first capacitor, and a second end coupled to the second node;
   a fourth transistor including a first end coupled to the first end of the first capacitor, and a second end coupled to the second node; and
   a second circuit including a first input terminal coupled to the second node, a second input terminal coupled to a second end of the fifth capacitor, a first output terminal coupled to a gate of the third transistor, and a second output terminal coupled to a gate of the fourth transistor.

6. The charge pump circuit according to claim 5, wherein
the first circuit includes a first NAND circuit and a first NOR circuit,
the first NAND circuit including:
a first input terminal coupled to the first node;
a second input terminal coupled to the second end of the third capacitor; and
an output terminal coupled to the gate of the first transistor,
the first NOR circuit including:
a first input terminal coupled to the first node;
a second input terminal coupled to the second end of the third capacitor; and
an output terminal coupled to the gate of the second transistor, and
the second circuit includes a second NAND circuit and a second NOR circuit,
the second NAND circuit including:
a first input terminal coupled to the second node;
a second input terminal coupled to the second end of the fifth capacitor; and
an output terminal coupled to the gate of the third transistor,
the second NOR circuit including:
a first input terminal coupled to the second node;
a second input terminal coupled to the second end of the fifth capacitor; and
an output terminal coupled to the gate of the fourth transistor.

7. The charge pump circuit according to claim 5, wherein
the first transistor and the third transistor are P-type MOS transistors, and
the second transistor and the fourth transistor are N-type MOS transistors.

8. The charge pump circuit according to claim 7, wherein
the first end of each of the first transistor, the second transistor, the third transistor, and the fourth transistor is a source, and
the second end of each of the first transistor, the second transistor, the third transistor, and the fourth transistor is a drain.

9. A drive device comprising a charge pump circuit, the charge pump circuit including:
a first capacitor including a first end to which a first voltage is supplied;
a second capacitor including a first end to which a first pulse signal is supplied, and a second end coupled to a first node;
a third capacitor including a first end to which the first pulse signal is supplied;
a first transistor including a first end coupled to a second end of the first capacitor, and a second end coupled to the first node;
a second transistor including a first end coupled to the first end of the first capacitor, and a second end coupled to the first node;
a first circuit including a first input terminal coupled to the first node, a second input terminal coupled to a second end of the third capacitor, a first output terminal coupled to a gate of the first transistor, and a second output terminal coupled to a gate of the second transistor; and
an output terminal coupled to the second end of the first capacitor,
the drive device being configured to drive an external motor based on a voltage of the output terminal.

10. The drive device according to claim 9, wherein
the first circuit includes a first NAND circuit and a first NOR circuit,
the first NAND circuit including:
a first input terminal coupled to the first node;
a second input terminal coupled to the second end of the third capacitor; and
an output terminal coupled to the gate of the first transistor,
the first NOR circuit including:
a first input terminal coupled to the first node;
a second input terminal coupled to the second end of the third capacitor; and
an output terminal coupled to the gate of the second transistor.

11. The drive device according to claim 9, wherein
the first transistor is a P-type MOS transistor, and
the second transistor is an N-type MOS transistor.

12. The drive device according to claim 11, wherein
the first end of each of the first transistor and the second transistor is a source, and
the second end of each of the first transistor and the second transistor is a drain.

13. The drive device according to claim 9, further comprising:
a fourth capacitor including a first end to which a second pulse signal is supplied, and a second end coupled to a second node, the second pulse signal being an inverted signal of the first pulse signal;
a fifth capacitor including a first end to which the second pulse signal is supplied;
a third transistor including a first end coupled to the second end of the first capacitor, and a second end coupled to the second node;
a fourth transistor including a first end coupled to the first end of the first capacitor, and a second end coupled to the second node; and
a second circuit including a first input terminal coupled to the second node, a second input terminal coupled to a second end of the fifth capacitor, a first output terminal coupled to a gate of the third transistor, and a second output terminal coupled to a gate of the fourth transistor.

14. The drive device according to claim 13, wherein
the first circuit includes a first NAND circuit and a first NOR circuit,
the first NAND circuit including:
a first input terminal coupled to the first node;
a second input terminal coupled to the second end of the third capacitor; and
an output terminal coupled to the gate of the first transistor,
the first NOR circuit including:
a first input terminal coupled to the first node;
a second input terminal coupled to the second end of the third capacitor; and
an output terminal coupled to the gate of the second transistor, and
the second circuit includes a second NAND circuit and a second NOR circuit,
the second NAND circuit including:
a first input terminal coupled to the second node;
a second input terminal coupled to the second end of the fifth capacitor; and
an output terminal coupled to the gate of the third transistor, the second NOR circuit including:
a first input terminal coupled to the second node;
a second input terminal coupled to the second end of the fifth capacitor; and
an output terminal coupled to the gate of the fourth transistor.

15. The drive device according to claim 13, wherein
the first transistor and the third transistor are P-type MOS transistors, and
the second transistor and the fourth transistor are N-type MOS transistors.

16. The drive device according to claim 15, wherein
the first end of each of the first transistor, the second transistor, the third transistor, and the fourth transistor is a source, and
the second end of each of the first transistor, the second transistor, the third transistor, and the fourth transistor is a drain.

* * * * *